United States Patent [19]
Herchen

[11] Patent Number: 5,747,917
[45] Date of Patent: May 5, 1998

[54] DOUBLE-WALLED MIRCROWAVE PLASMA BASED APPLICATOR

[75] Inventor: Harald Herchen, Fremont, Calif.

[73] Assignee: Applied Materials, Inc., Santa Clara, Calif.

[21] Appl. No.: 601,477

[22] Filed: Feb. 14, 1996

[51] Int. Cl.⁶ .............................. H01J 17/26; H01J 61/28; H01J 7/24; H05B 31/26
[52] U.S. Cl. ........................ 313/231.31; 313/231.51; 313/231.61; 315/111.21
[58] Field of Search .................. 313/231.31, 231.51, 313/233.61, 17, 18, 22, 24–26; 315/2, 111.21; 219/121.48; 118/723 MW; 204/298.31, 164

[56] References Cited

U.S. PATENT DOCUMENTS 5,126,635  6/1992  Doehler et al. ............... 313/231.31

Primary Examiner—Sandra L. O'Shea
Assistant Examiner—Mack Haynes
Attorney, Agent, or Firm—Michael A. Glenn; Peter J. Sgarbossa

[57] ABSTRACT

An improved plasma applicator uses a double-walled sapphire sleeve assembly to provide a high efficiency cooling mechanism that is adapted for use with high power applications and aggressive plasma chemistries in the generation of a plasma. Plasma contained within a highly thermally emissive first sapphire member heats the member, causing it to radiate thermal energy. The radiated thermal energy crosses a narrow gap and passes through an infrared-transparent second sapphire member. An infrared-absorbing coolant fluid that exhibits negligible microwave absorption is flowed in a second gap between the second sapphire member and a third member and absorbs most of the infrared radiation over the fluid's bulk. The use of a bulk fluid optimizes the cooling of the plasma to reduce ion and electron density and maximize reactive species output from the applicator to a vacuum process chamber.

23 Claims, 5 Drawing Sheets

DOUBLE-WALLED MIRCROWAVE PLASMA BASED APPLICATOR

BACKGROUND OF THE INVENTION

1. Technical Field

The invention relates to plasma processing and plasma processing equipment. More particularly, the invention relates to a method and apparatus for cooling a plasma applicator.

2. Description of the Prior Art

Plasma processing is an essential tool of the semiconductor manufacturing industry. Such processing uses electromagnetic radiation to strike a plasma that dissociates the molecules of a process gas and thereby produces a reactive species that is used for such process steps as wafer etching. A plasma may be produced directly above the surface of the wafer within the process environment, or the plasma may be remotely generated in an applicator, and then conducted to the surface of the wafer.

The semiconductor industry is approaching fabrication of 300 mil wafer size flat panel displays that are 2 or 3 feet in diagonal size. For such applications, substantially higher microwave power in the range of 3 kilowatts up to 10 kilowatts is required to effect etching, cleaning, and CVD processes. It is thought that approximately 65% of this power has to be removed in the applicator by thermal means.

Three methods are currently available to remove this thermal energy—conduction, convection and radiation. Known applicators may use conduction from a surface to a liquid to remove the thermal energy. At the microscopic level, the conduction process produces local areas of high heat flux that cause the liquid to boil or vaporize. The local heat transfer may be substantially reduced at this vaporization point.

Another available thermal energy removal technique is use of a liquid metal based heat pipe, such as a sodium heat pipe or a lithium heat pipe. However, because liquid metal based heat pipes are not formed of dielectric materials, their use is unacceptable when microwave energy provides the source of plasma excitation.

A solid to liquid heat transfer mechanism is limited to approximately 100,000 to 200,000 watts per meter$^2$. This range is dependent upon the operating pressure of the processing environment. Such heat transfer rates are generally insufficient to handle high power applications and aggressive plasma chemistries. Thus, thermal energy at these higher levels is more effectively removed by use of radiation.

Effective use of radiation for the removal of such thermal energy requires that the applicator tube be made of a material that is capable of radiating such energy without breaking or melting. One known technique uses radiation to remove thermal energy involves allowing metal walls of an applicator to absorb the thermal energy. The walls are then cooled, thereby removing the thermal energy. Frequently, however, not all of the radiated thermal energy is absorbed by the walls on the initial pass of the coolant through the applicator. This results in a loss of heat transfer efficiency. Additionally, the available surface area of the metal walls is a limiting factor to the amount of thermal transfer that is possible. Furthermore, it is extremely difficult to design an environment for remote plasma generation in an applicator surrounded by such metal walls, e.g. the metal is conductive and therefore interferes with the propagation of microwave energy into the applicator.

FIG. 1 is a schematic diagram showing a typical plasma processing environment 10 according to the prior art. The plasma processing environment includes a process chamber 12 and an applicator 15 that is used to generate a remote plasma. Some state of the art plasma applicators comprise a tube, open at at least one end, through which a process gas is pumped. The process gas is supplied from a source 14 and may comprise such gases as $CF_2$, $O_2$, $N_2$, $Cl_2$, and $NF_3$. A waveguide 13 is also provided through which a source of electromagnetic energy 11, such as an RF signal or a microwave signal, is directed to the tube to strike and maintain a plasma within the tube.

Reactive species produced by the plasma thus generated are directed out of the open end of the tube through a transport conduit 20. The reactive species are directed to the process chamber 12. A gas diffusion plate 17 is typically used to spread the plasma to provide an even distribution of the reactive species within the process chamber, thereby promoting uniform wafer processing. The reactive species are directed towards a workpiece, typically a semiconductor wafer 18, and are thence exhausted from the process chamber through an exhaust port 19.

The plasma generated within the applicator contains ions and electrons, as well as the desired reactive species. Any charged species present in the gas delivered from the applicator can produce local variations in the electric field within the vacuum process chamber. Such induced variations in the electric field can result in various problems that include charge-up damage or gate oxide integrity violations, and that can very rapidly degrade wafer yields.

To minimize such damage to the wafer, all plasma generated in the applicator must be rapidly extinguished before the reactive species are output therefrom. The plasma may be extinguished by removing energy from the plasma. It is thought that approximately 65% of the plasma energy may be removed from the applicator in the form of thermal energy.

The remote plasma applicator 15 may be thought of as a hollow tube having end caps, where the plasma shape is also a hollow tube with end caps. Thus, the applicator is like a tin can, having gases only inside. When the reactive gas enters the applicator, it is fed from one end of the tube at the inside edges thereof. However, the gas is not exposed to a plasma until it has traveled through the top cap at the end of the tube. Diffusion is required for the gas to reach the plasma near the top end of the tube when the gas is injected at the top center. By injecting the gas near the inside edge of the tube, the gas is exposed to the plasma longer than if it is injected at the center because diffusion is not required for immediate exposure to the plasma.

It is known to use a sapphire tube when fabricating a plasma applicator assembly. Such tube allows plasma generation along a tube length of up to about 12 inches. Unfortunately, the intense heat generated by plasma generation poses particular problems concerning the cooling of a sapphire applicator. Cooling must be even across the surface of the tube, and yet must not interfere with the flow of electromagnetic energy into the tube. Most known coolants, such as water, are difficult to use in a system that generates a plasma using microwave energy because the coolant itself may absorb such energy, creating yet additional heat. Additionally, water cooling has required the use of carefully spaced metal tubing as a conduit, where the spacing of such tubing can critically affect the transfer of electromagnetic energy into the applicator.

One approach to cooling an applicator tube, such as an applicator tube that is made of sapphire, is to provide a jacket about the tube having a very thin gap of about 1 mil that allows water to circulate between the tube and the jacket. However, it is incredibly difficult to maintain a 1 mil gap over a span of 11 inches. If a tube is machined that does not meet this stringent requirement, the tube cannot be used and must be thrown away.

Additionally, a sapphire tube itself is highly fragile, and therefore must be mounted to the applicator assembly in a manner that does not mechanically stress the tube in such way as to cause the tube to fail. Such mounting must also be sufficiently secure that it holds the tube in a desired configuration, especially if an outer cooling jacket which defines a gap having a critical clearance is associated with the tube. Any substantial deviation across a cooling cross section may result in hot spots at which the tube could fail. The mounting must also be configured to prevent the reactive gas and/or the plasma from leaking into the applicator assembly, and to prevent outside atmosphere or other fluids from entering the reactive gas and/or plasma region.

FIG. 2 is a simplified, sectioned side elevation view of a plasma applicator according to the prior art. A similar double-walled applicator is disclosed in the copending, commonly assigned U.S. patent application entitled *Microwave Plasma Based Applicator*, Ser. No. 08/499,984, filed on 10 Jul. 1995. In such system, a reactive gas is supplied to the applicator from a gas source 14. The gas enters the applicator and is conducted to a plenum 31 which is defined in an end plate 28 above an end disk 25. The plenum provides a volume in which a back pressure is established that ensures that plasma cannot get above the end disk.

The end disk 25 and inlet ports 26 comprise a porting arrangement that directs the reactive gas down the edges of the applicator tube 30. The end disk 25 has a series of symmetrically situated apertures 26 formed therethrough, just inside the inside diameter of the applicator tube. Electromagnetic energy, supplied by a source 11, enters an opening in the applicator through a waveguide 13 that is inserted through the applicator substantially transverse to the axis thereof in the preferred embodiment of the invention. The electromagnetic energy ignites the reactive gas to generate a plasma.

An outside tube 37 encircles the applicator tube and defines a gap 16 therebetween through which a coolant, supplied from a coolant source 80, may be circulated. The applicator tube is preferably mounted with no torque applied thereto, and without requiring very tight machining tolerances.

In one embodiment of this applicator, a coolant, such as a perfluorinated polyether, is preferably used that exhibits negligible microwave absorption, that thereby ensures that the microwave power deposition into the plasma is more stable and predictable, and that provides a microwave induced electric field pattern that is not significantly altered by the presence of the coolant.

It would be advantageous to provide an applicator for the remote generation of a plasma, in which a bulk fluid coolant is brought as close to source of thermal radiation as possible to remove thermal energy from the applicator. It would be a further advantage if such an applicator allowed the use of higher power levels and more aggressive plasma chemistries for use in state of the art and evolving processes.

SUMMARY OF THE INVENTION

The invention provides an improved plasma applicator that allows the use of higher power levels and more aggressive plasma chemistries during a plasma processing step.

The plasma is contained within a first sapphire member that exhibits a high degree of thermal emissivity. The first member is heated sufficiently by the plasma that it radiates thermal energy, typically in the infrared region of the spectrum. The thermal energy radiates across a narrow low pressure gap and through a coaxial, sapphire member that encircles the first member and that exhibits a high degree of thermal transparency. The narrow gap minimizes any conductance of heat from the first member to the second member due to thermal contact, for example via a thermally conductive medium within the gap.

A coolant fluid that exhibits negligible microwave absorption is flowed in the gap between the second sapphire member and a coaxial third member that encircles the double-walled sleeve assembly. The coolant fluid exhibits thermal properties that enable it to absorb most of the radiated thermal energy over its bulk. The second member preferably maintains a vacuum in the narrow gap and also retains the fluid, thereby preventing the fluid from leaking into the first member and contacting the plasma.

The invention brings the coolant as close as possible to the source of thermal radiation, thereby optimizing the cooling of the plasma to reduce ion and electron density and maximize reactive species output to the vacuum process chamber. Such bulk cooling of the plasma provides a high efficiency cooling mechanism that is particularly useful in high power applications and/or with aggressive plasma chemistries.

DETAILED DESCRIPTION OF THE INVENTION

Figure 1:
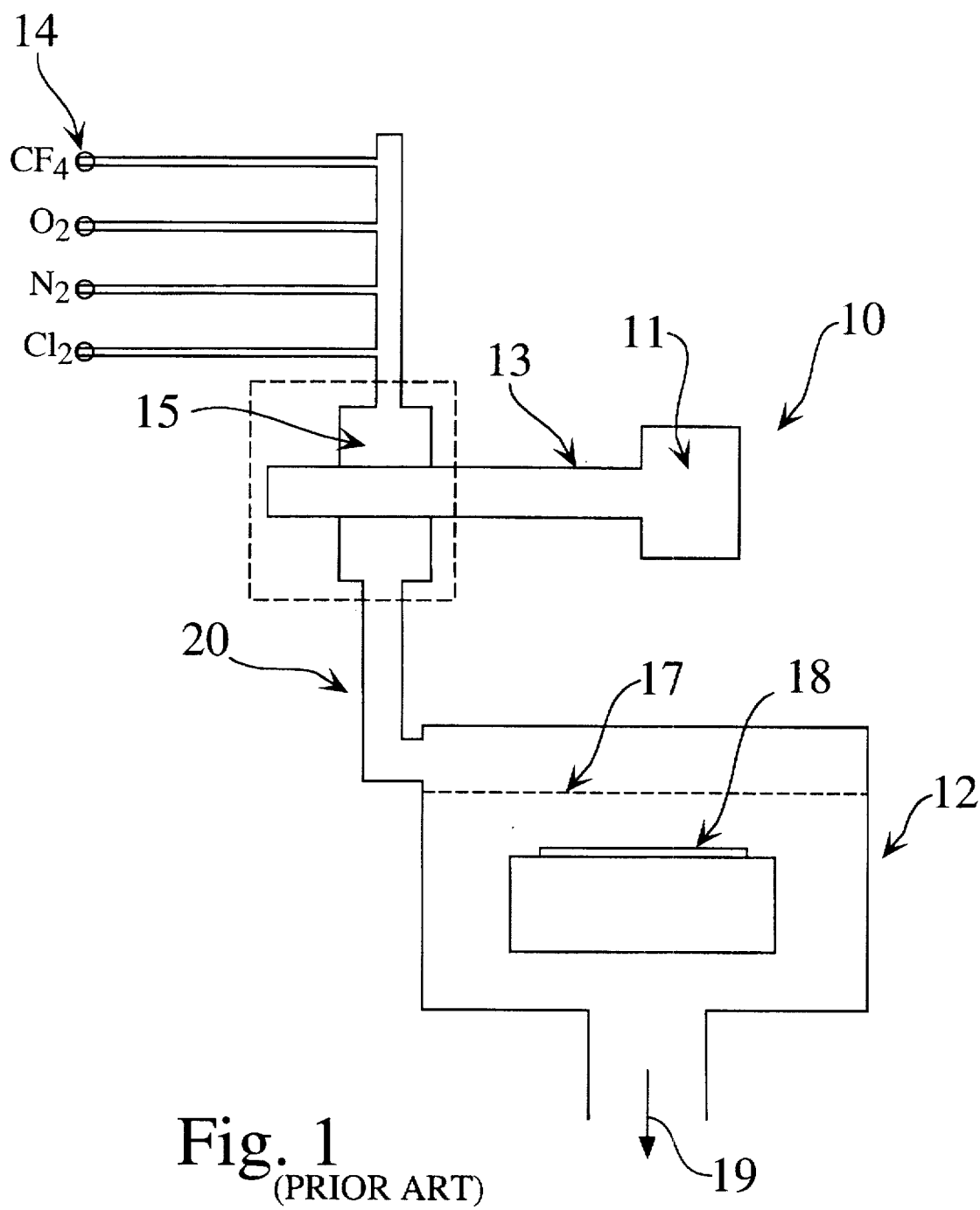
FIG. 1 is a schematic diagram that shows a typical plasma processing environment that includes a process chamber and an applicator for generating a remote plasma according to the prior art.
Figure 2:
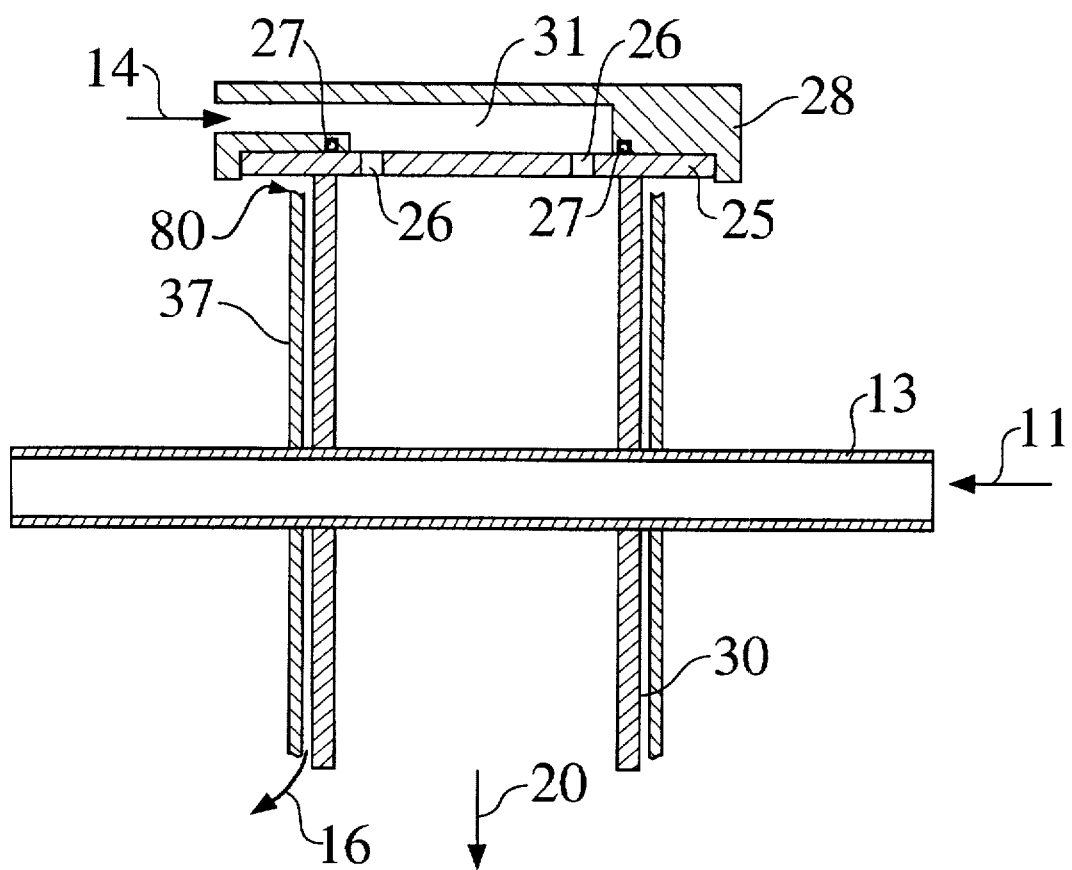
FIG. 2 is a simplified, sectioned side elevation view of a plasma applicator according to the prior art.
Figure 3:
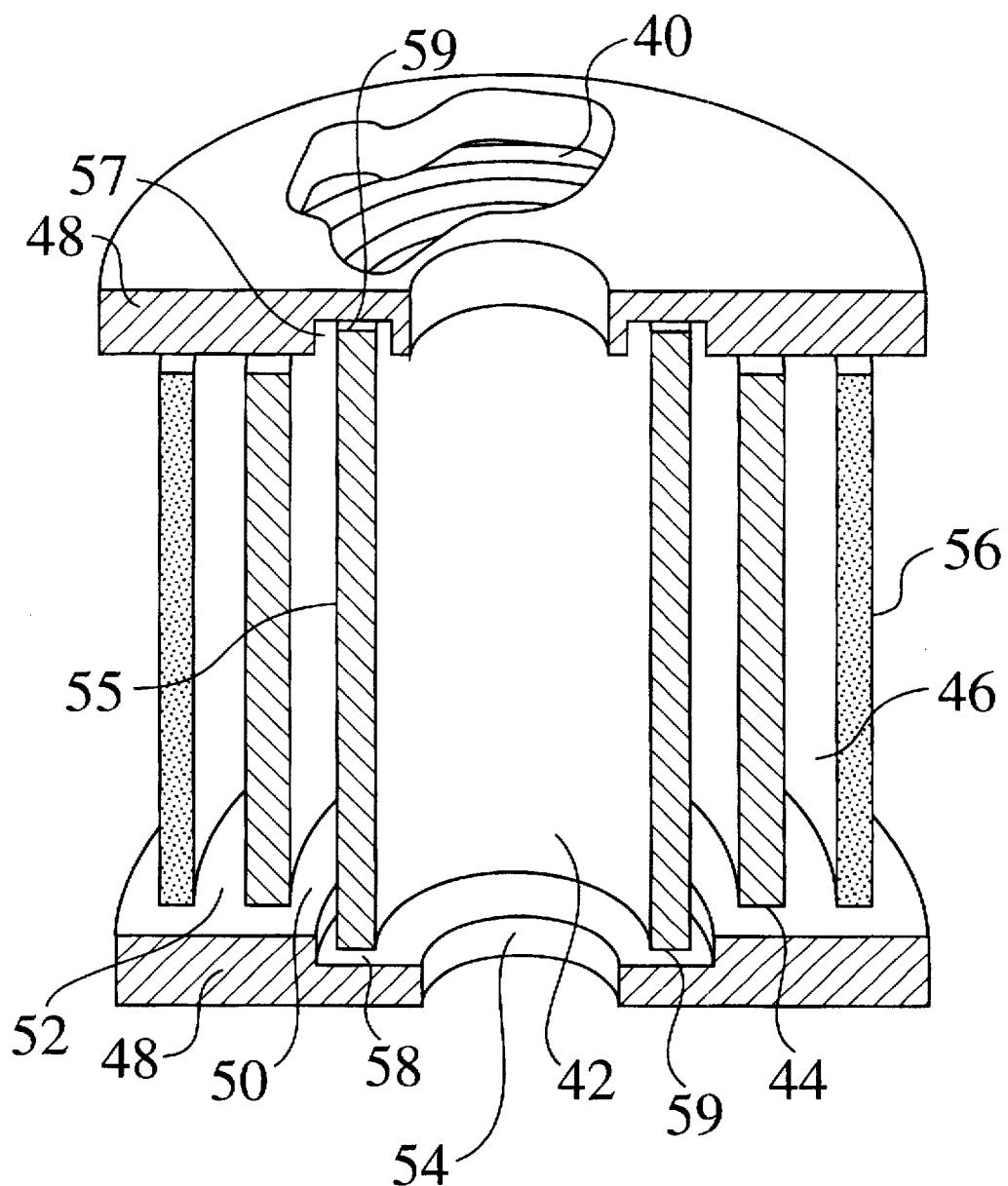
FIG. 3 is a sectioned side view of a plasma applicator according to the invention.

FIG. 3 is a sectioned side view of a double-walled plasma applicator 40 according to the invention. The applicator includes a double-walled assembly that comprises a tubular first member 42 and a coaxial tubular second member 44 the encircles the first member. A coaxial tubular third member 46 encircles this double-walled assembly. The plasma is generated within the bore 54 of the first member by application of microwave energy to a process gas contained therein, as is well known in the art. It is also known that magnetic fields surrounding the applicator may optionally be provided to enhance the active species production in the plasma.

The first member is heated sufficiently by the plasma to cause it to exhibit radiate thermal energy. The first member is chosen to exhibit increasing thermal emissivity with increasing temperature. The peak thermal energy typically radiates at a wavelength that is at least in the infrared spectrum. However, in alternate embodiments of the invention, the peak thermal energy may be radiated at a wavelength in the visible light range. The thermal energy radiates across the narrow gap 50 between the first and second member and through a preferably infrared-transparent wall of the second member. The narrow gap may be maintained under an evacuated condition, thereby preventing any conductance of thermal energy between the first member and the second member that may result from such factors as thermal contact through a fluid medium contained within the gap.

An infrared-absorbing coolant fluid is flowed in the gap 52 between the second member and the third member. The coolant fluid preferably absorbs most of the thermal radiation over the fluid's bulk. The third member preferably maintains a low pressure region in the narrow gap between the first and second member, and also retains the fluid within the gap, thereby preventing the fluid from leaking into the bore of the first member and contacting the plasma.

Figure 4:
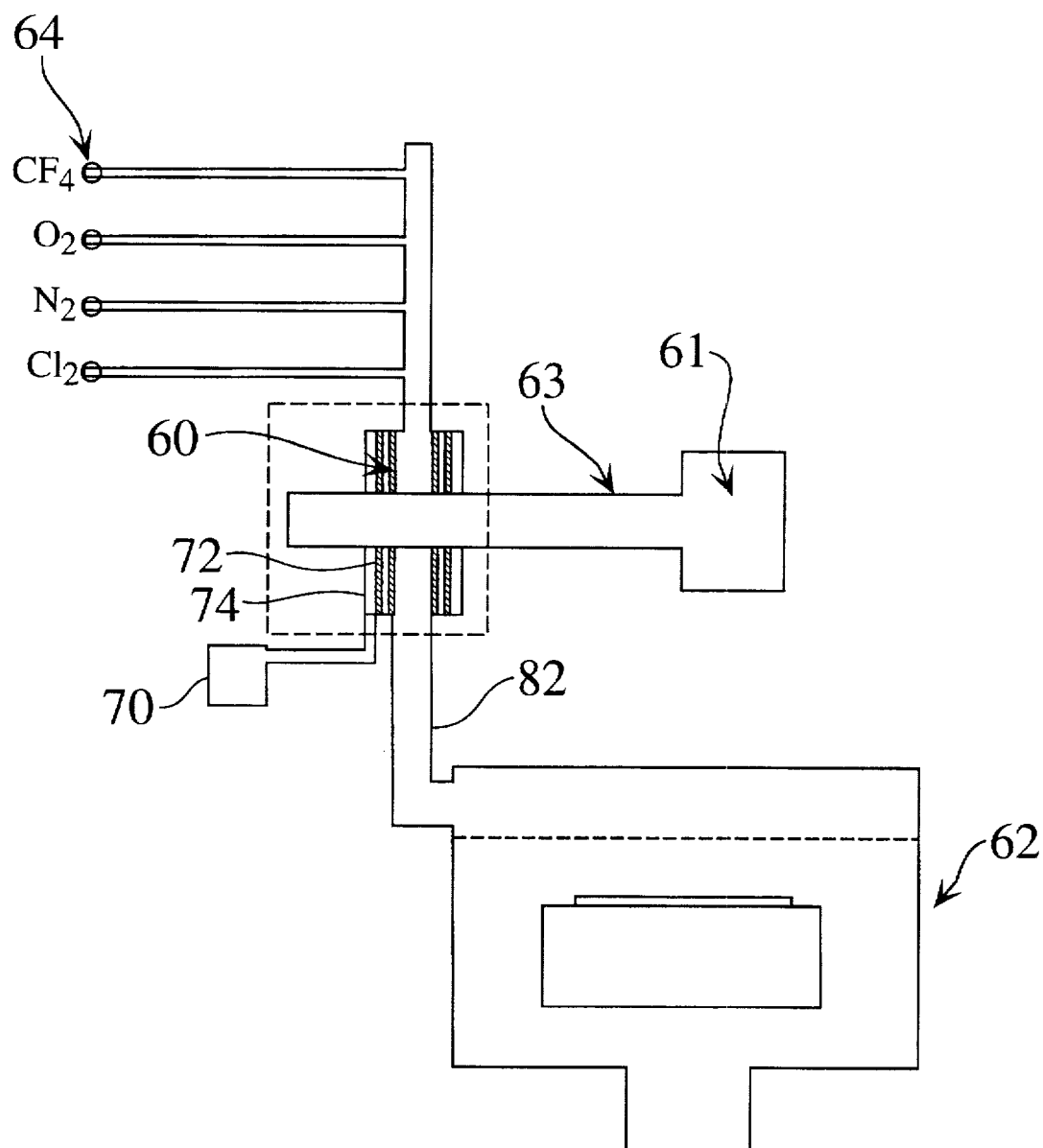
FIG. 4 is a schematic diagram that shows a typical plasma processing environment that includes a process chamber and an applicator for generating a remote plasma according to the invention.

FIG. 4 is a schematic diagram that shows a typical plasma processing environment that includes a process chamber and an applicator for generating a remote plasma according to the invention. A process gas is pumped from a gas source 64 to the applicator 60. A waveguide 63 is provided through which a source of electromagnetic energy 61 is directed into the applicator to ignite and maintain a plasma therein. A pump 70 circulates the coolant fluid through the gap between the second 72 and third 74 members. The plasma thus generates reactive species that are directed out of the open end of the tube, through a transport conduit 82, and toward the process chamber 62.

The first and second members are preferably tubes formed of a material, such as single crystal sapphire, that has high resistance to the corrosive conditions that exist within the applicator. Single crystal sapphire is an aluminum oxide that has well known properties, such as a high level of chemical resistance, and much higher thermal conductivity than quartz, thereby allowing greater heat transfer to take place from the inside of the tube to the tube outer surface. Sapphire tubes of the type described herein may be purchased from such companies as Saphikon of Milford, New Hampshire. It will be appreciated by those skilled in the art that the applicator may also be formed of materials other than sapphire.

For most compounds, including sapphire, the spectral emissivity and the spectral absorptivity are identical. Emissivity refers to the amount of light power given out at a particular wavelength at a specified temperature. Emissivity for purposes of the invention is a function of wavelength for sapphire.

Figure 5:
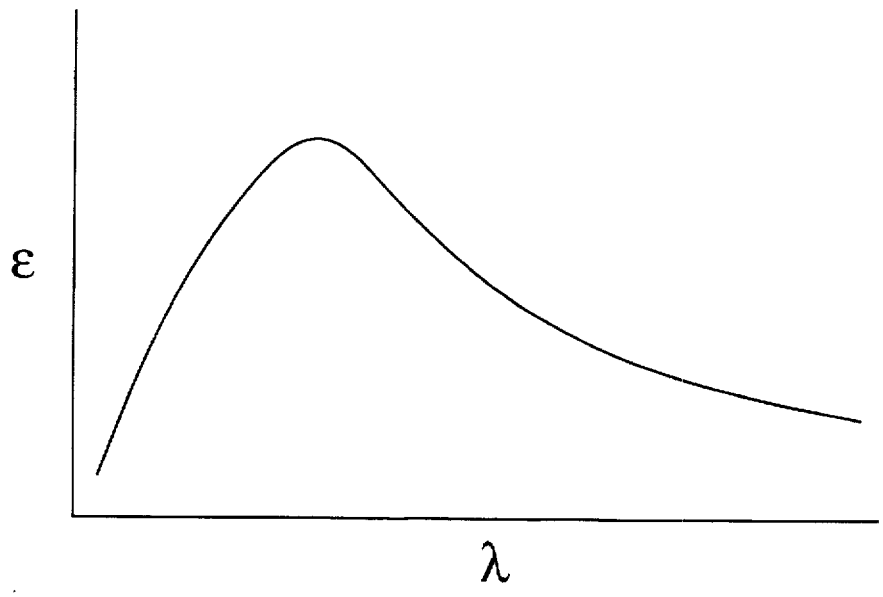
FIG. 5 is a graph of the emissivity of the first member as a function of the wavelength of the infrared radiation according to the invention.
Figure 6:
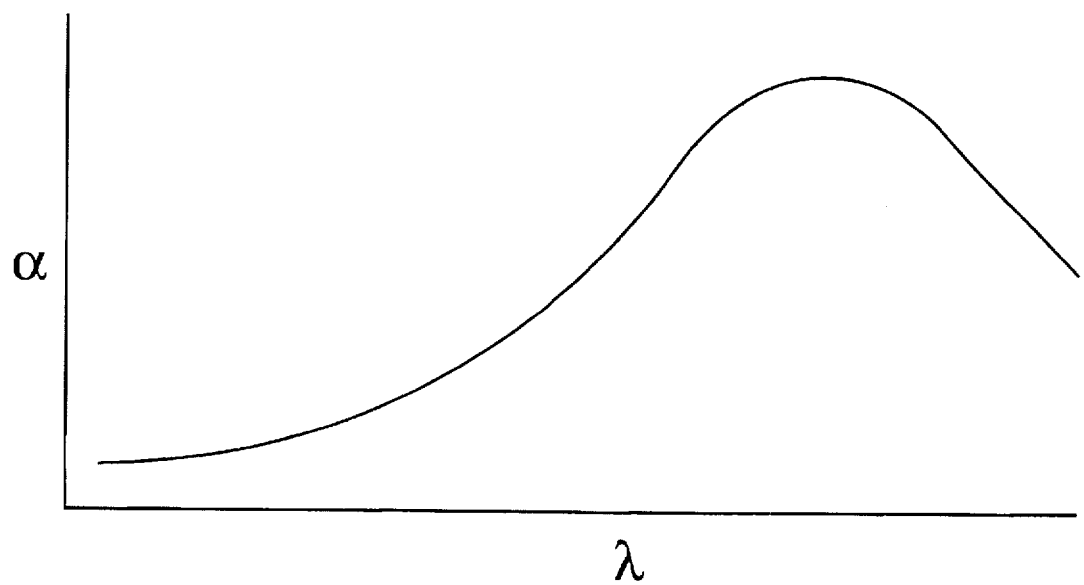
FIG. 6 is a graph of the absorptivity of the second member as a function of the wavelength of the infrared radiation according to the invention.

Furthermore, sapphire infrared absorption and emission characteristics are temperature-dependent. In general, the emissivity peak approaches shorter and shorter wavelengths as temperature is increased. FIG. 5 is a graph of the emissivity of the first member as a function of the wavelength of the infrared radiation. The Y axis of the graph indicates the emissivity $\epsilon$ of the first sapphire member. FIG. 6 is a graph of the absorptivity of the second member as a function of the wavelength of the infrared radiation. The Y axis of the graph indicates the absorptivity $\alpha$ of the second sapphire member.

The total radiating power of the first sapphire member increases as a function of the temperature to the 4th power. Thus, a small increase in the first member temperature results in a large increase in the radiating power. For the preferred operating conditions of the invention, the temperature of the first sapphire member ranges between about 1200° C. if the emissivity is 1, or as high as about 20000° if the emissivity is 0.05. For example, more light or radiation is emitted at a wavelength of 1.2 microns when the sapphire is hot. The hot first member thus achieves peak emission at shorter wavelengths. The amount of light emission drops off as the wavelength increases from the peak.

When the sapphire is cool, it emits most of its radiation at a wavelength of approximately 4 or 5 microns. The coolant fluid maintains the second member at a significantly cooler temperature than the first member. Because emissivity and absorptivity are typically identical for sapphire, the peak absorption for the cool second member is thus at a wavelength of approximately 4 or 5 microns. However, most of the light emitted from the hot first member is at a shorter wavelength of approximately 1.2 microns, where the absorptivity of the second member is low. Thus, most of the radiated thermal energy is transferred through the second member and into the coolant fluid without appreciably raising the temperature of the second member.

Several techniques are known in the art to enhance the emissivity of a sapphire tube. One known method exposes the sapphire to ultraviolet radiation to induce bulk defects in the tube. These bulk defects, referred to as color centers, are minor variations in the crystal structure that cause the light to be absorbed and re-emitted in such a way as to increase the emissivity. The emissivity of sapphire treated in such a manner readily approaches 1, with a resulting temperature of approximately 1200° C. Sapphire is very stable up to within approximately 20° to 30° C. of its melting point at 2053° C. The temperature of the tube therefore remains well within the structural limits of the sapphire. In the preferred embodiment of the invention, only the first tubular member is treated with the ultraviolet radiation because it is important that the absorptivity of the second member remain low so that its heat absorption remains low.

The coolant fluid must absorb thermal energy which, in the preferred embodiment of the invention, is typically infrared radiation. However, the coolant fluid must not appreciably absorb the microwaves used to generate the plasma. In the preferred embodiment of the invention, the fluid is a liquid coolant, e.g. a hydrotreated middle distillate (CAS No. 64742-46-7). Examples of such liquids include hydraulic fluid and various types of petroleum distillates. Pennzoil Corporation of Houston, Tex. produces a suitable low temperature hydraulic fluid known by the trade name Frigi-Tranz. For semiconductor processing applications, pure liquids having readily predictable properties are required. Because hydraulic fluid is typically dyed red, distillation is required to remove the coloring before fluids such as Frigi-Tranz are acceptable for use with the applicator of the invention. Some symmetrical molecules and fluorinated compounds also tend to absorb infrared radiation, yet have low microwave absorption and are therefore also usable.

In the prior art, heat transfer is effected by providing a rapid coolant fluid flow and an accompanying fluid turbulence. This may be accomplished by providing a quartz outer member having a high degree of surface roughness. According to the invention, heat transfer is effected through bulk transfer to the cooling liquid, rather than through rapid fluid flow and turbulence. Thus, the invention provides the outer, third member to retain the coolant fluid. The second member is a dielectric and therefore is transparent to microwaves, but non-conductive. Dielectric materials, such as quartz, ceramic and Teflon™, are appropriate for use in fabricating the second member. However, other materials may be substituted without departing from the spirit and scope of the invention.

The width of the gap between the third member and the second member is determined by the absorption coefficient in the infrared range of the coolant fluid. The range for the width of the gap is from approximately one millimeter to approximately one centimeter. For example, Frigi-Tranz has a relatively high absorption coefficient, and a width of approximately 2 mm is sufficient to allow the Frigi-Tranz to absorb most of the infrared radiation.

In one embodiment of the invention, any infrared radiation that is not absorbed on the first pass through the coolant fluid may be reflected off a metal wall 56 that surrounds the third member. This reflected thermal energy passes back through the coolant fluid and is largely absorbed by the fluid prior to returning to the plasma in the first tube. Also, the metal wall may ensure that the microwave energy imparted to the plasma is retained within a region around the first tube.

The flow rate of the coolant fluid is dictated by the amount of thermal energy to be removed from the applicator. Typically, coolant fluids have heat capacities of approximately $\frac{1}{10}$th to 1 calorie per gram. The appropriate fluid flow rate for such coolant fluids is therefore approximately 3 to 5 liters a minute. Because there is a relatively large gap between the second member and the third member, there is a low pressure drop from top to bottom of the gap. Accordingly, a low fluid pressure is maintained in the gap. Furthermore, conventional pumping means may be used to move the fluid through the gap.

The double-walled microwave plasma applicator is designed to take into account the thermal expansion of the first sapphire member during plasma generation therein. During such time, the first sapphire member may reach temperatures upwards of 2000° C. At such a temperature, an 11 or 12 inch long sapphire tube expands approximately 0.03 inch. It is therefore of critical importance to mount the first sapphire member in such a way as to minimize the heat transfer to the mounting mechanism, while allowing for thermal expansion of the sapphire. In the preferred embodiment of the invention, disks 48 having a recessed counter bore 58 are used to retain the ends 59 of the first member. In the preferred embodiment of the invention, the disk is made of sapphire to provide a high resistance to the corrosive conditions that exist within the applicator. However, other materials may be substituted for sapphire without departing from the spirit and scope of the invention.

The outer surface of the first member 55 is in contact with the inner surface of the counter bore 57. The counter bore thereby supports the first member from the sides, but does not restrain its ends. Thus, allowance is made for thermal expansion. Furthermore, heat transfer to the sapphire disk is substantially reduced by permitting the first sapphire member substantially to float within the counter bore.

Some leakage of the process gas into the gap between the first and second sapphire members is acceptable if the gap is sufficiently small to prevent plasma formation in that region. A gap of less than 100 mean free paths is sufficient to ensure that any plasma that is inadvertently created in the gap is extinguished by rapid recombination. Because the mean free path of the process gas molecules is determined by local pressure, the width of the gap is dependent on the operating pressure of the applicator. For example, at a pressure of 1 Torr, the mean free path is approximately $10^{-4}$ meters. Any generated plasma is extinguished, therefore, in gaps of less than 100 times this mean free path. Such gaps have widths that are readily machinable.

The expansion of the first member during thermal cycling is in both longitudinal and radial directions. However, the total amount of such expansion is dependent upon the original diameter or length of the sapphire member. In the preferred embodiment of the invention, the first member has a diameter of approximately 3 to 4 centimeters. At a temperature of approximately 2000° C., the radial expansion of such a sapphire tube is approximately $\frac{1}{4}$ the expansion of the length. Thus, at 2000° C. the thermal expansion of the diameter is approximately $\frac{8}{1000}$ths of an inch. The sapphire disk must therefore provide this amount of clearance in the counter bore.

In the preferred embodiment of the invention, the first sapphire member is approximately 11 or 12 inches long. The first member is slightly longer than the second member so as to fit within, and be supported by, the counter bore of the sapphire disk. Because the transfer of thermal energy is effected by radiation, a thinner sapphire layer provides less material to radiate heat. However, because the first sapphire member has high thermal conductivity and an emissivity of approximately 1, a thickness of approximately between 30 to $\frac{50}{1000}$ths of an inch is satisfactory. The thickness of the second sapphire member is not critical to ensure that the cooling of the plasma. Thus, the structural integrity of the second sapphire member is also readily maintained with a wall thickness of between 30 to $\frac{70}{1000}$ths of an inch.

When the process gas enters the system, it also must not escape to the side. Therefore, a resilient seal, such as an O-ring (not shown), is provided to seal the applicator against gas leakage. Similarly, additional resilient seals, such as O-rings, are provided to ensure that the applicator maintains its integrity. Other sealing means may also be used without significantly departing from the scope and spirit of the invention.

The double-walled microwave plasma based applicator offers several advantages over prior art applicators:

Radiation transferred from the hot plasma passes through an infrared-transparent window and then to a fluid. The preferred embodiment of the invention uses liquid coolant because liquids have good convective heat transfer properties. The cooling liquid is heated in bulk and rapidly removed. Bulk heating the liquid greatly reduces the difficulties associated with removing thermal energy from the surface of heated walls.

Greater quantities of fluid are used in the applicator. Thus, higher power levels can be used and larger surfaces can be processed, e.g. flat panel displays.

Another advantage of the double-walled approach is that it brings the bulk fluid coolant as close to the source of radiation as possible. The liquid coolant efficiently carries the radiated heat away without having further thermal transfer requirements, such as through conduction in walls of the applicator tube.

In the double-walled microwave plasma based applicator, the plasma itself radiates a substantial amount of thermal energy. This radiation is directly absorbed by the liquid. It does not have to be converted to kinetic energy or vibrational energy of the sapphire before being re-radiated out. Thus, the plasma is directly cooled with its radiation being absorbed by the cooling liquid.

The plasma generated within the applicator contains ions and electrons as well as the desired reactive species. The species delivered to the vacuum process chamber must be largely neutral but- activated radicals, or chemically active species. Thus, the ions and electrons must be eliminated or reduced in quantity by at least 6 or 7 orders of magnitude prior to delivery to the vacuum process chamber. To use the applicator effectively, all plasma in the applicator chamber must be rapidly extinguished. The plasma is extinguished by removing energy. Approximately 65% of the plasma energy, is removed thermally within the applicator. Recombination of the plasma therefore is effected within a few centimeters downstream of the microwave field.

Any charged species present in the gas delivered from the applicator can produce local variations in the electric field within the vacuum process chamber. This is due to local variations of the conductivity on the surface of the wafer. Such induced variations in the electric field can cause problems including charge-up damage or gate oxide integrity violations. These induced variations therefore very rapidly degrade the yield of the dies on the wafer. Furthermore, advanced vacuum process chambers, such as those appropriate for use with the double-walled microwave plasma based applicator, almost all use electrostatic chucks. An electrostatic chuck is a mechanism for holding wafers using electrostatic attraction. The electrostatic chucks in current use are not capable of handling a plasma. It is extremely difficult to modify such an electrostatic chuck to handle a plasma.

The double-walled microwave plasma based applicator offers the advantage of effective heat removal from the plasma. This improved energy removal mechanism translates to a substantial reduction in the ion and electron density, leaving radicals for delivery into the vacuum process chamber. Radicals have much lower energy than chemical energy, and their radiation is much reduced from plasma radiation. Accordingly, the problems of charge-up damage, gate-oxide integrity violations and electrostatic chuck failure are minimized, if not eliminated.

Radicals are essential for an isotropic etching process. An isotropic etching process etches equally in all directions, permitting etching underneath a photoresist layer, for example. As the output of the invention is radicals, or reactive species, and not a plasma, use of the double walled microwave plasma based applicator promotes more efficient isotropic etching of the wafer.

Although the invention is described herein with reference to the preferred embodiment, one skilled in the art will readily appreciate that other applications may be substituted for those set forth herein without departing from the spirit and scope of the present invention. Accordingly, the invention should only be limited by the claims included below.

I claim:

1. A plasma applicator, comprising:
   a first member in which a plasma is generated;
   a second member that surrounds said first member, wherein a first gap is defined therebetween across which thermal energy generated by said plasma in said first member may radiate, said thermal energy also radiating through said second member; and
   a third member that surrounds said second member, wherein a second gap is defined therebetween through which a coolant fluid is circulated that absorbs said thermal energy radiated from said first member across said first gap.

2. The plasma applicator of claim 1, wherein said inner first member has high emissivity at a wavelength at which peak thermal energy is radiated.

3. The plasma applicator of claim 1, wherein said second member has low absorptivity at a wavelength at which peak thermal energy is radiated.

4. The plasma applicator of claim 1, wherein said first member has a peak emissivity at approximately 1.2 microns in wavelength.

5. The plasma applicator of claim 1, wherein said second member has a peak absorptivity at approximately 4 to 5 microns in wavelength.

6. The plasma applicator of claim 1, wherein said first and second members are made of sapphire.

7. The plasma applicator of claim 6, wherein said first sapphire member is processed during manufacture thereof to induce bulk defects that create variations in said member crystal structure and enhance emissivity of said member.

8. The plasma applicator of claim 7, wherein said first sapphire member is exposed to ultraviolet radiation to induce said bulk defects.

9. The plasma applicator of claim 1, wherein said first member has a length of approximately 11 to 12 inches.

10. The plasma applicator of claim 1, wherein said first and second members are between approximately 30 to 70/1000ths of an inch in thickness.

11. The plasma applicator of claim 1, wherein said third member is made of a dielectric material.

12. The plasma applicator of claim 11, wherein said dielectric material is selected from the group consisting of quartz, ceramic, or Teflon™.

13. The plasma applicator of claim 1, wherein said coolant fluid is a liquid.

14. The plasma applicator of claim 1, wherein said coolant fluid is a hydrotreated middle distillate.

15. The plasma applicator of claim 1, further comprising a metal wall surrounding said third member.

16. The plasma applicator of claim 1, further comprising:
   mounting means for securing at least said first member against movement, said mounting means so comprised as to minimize thermal energy transfer thereto while providing sufficient tolerance to accommodate thermally induced expansion of said first member.

17. The plasma applicator of claim 16, wherein said mounting means further comprises a disk having a recessed counter bore adapted to receive and retain said first member.

18. The plasma applicator of claim 17, wherein said disk is made of sapphire.

19. The plasma applicator of claim 17, further comprising a compliant material disposed above said disk, wherein the gap between said first and second sapphire members is reduced.

20. A process of generating a plasma within an applicator, comprising the steps of:
   generating a plasma within a first member, wherein thermal energy is radiated from said first member;
   providing a second member that surrounds said first member, wherein a first gap is defined therebetween across which thermal energy is radiated, wherein said second member is transparent to said thermal energy;
   providing a third member that surrounds said second member, wherein a second gap is defined therebetween; and
   circulating a coolant fluid through said second gap between said second member and said third member to absorb said radiated thermal energy by bulk cooling.

21. The process of claim 20, wherein said bulk fluid cooling of said plasma reduces plasma ion and electron density and maximizes reactive species output from said applicator.

22. The process of claim 20, wherein said first member is made of sapphire and is processed during manufacture thereof to induce bulk defects that create variations in said member crystal structure and enhance emissivity of said member.

23. The process of claim 20, wherein said first member has a peak emissivity at a short wavelength, and said second member has a peak absorptivity at a long wavelength.

* * * * *